United States Patent [19]

Itoh et al.

[11] Patent Number: 5,214,341

[45] Date of Patent: May 25, 1993

[54] PIEZOELECTRIC ACUTATOR DEVICE WITH VIBRATION ABSORBING MEANS

[75] Inventors: Kiyoshi Itoh; Minoru Hara, both of Kawasaki, Japan

[73] Assignee: Fujitsu Limited, Kanagawa, Japan

[21] Appl. No.: 886,499

[22] Filed: May 22, 1992

[30] Foreign Application Priority Data

May 23, 1991 [JP] Japan ................... 3-118407

[51] Int. Cl.$^5$ ........................ H01L 41/08; B41J 2/295
[52] U.S. Cl. ...................... 310/326; 310/328; 400/124
[58] Field of Search ............. 310/326, 345, 328; 400/124; 101/93.05

[56] References Cited

U.S. PATENT DOCUMENTS

| | | | |
|---|---|---|---|
| 2,227,072 | 12/1940 | Toro | 310/326 |
| 2,513,269 | 7/1950 | Bauer | 310/326 |
| 2,879,413 | 3/1959 | Smith-Johannsen | 310/326 |
| 3,307,055 | 2/1967 | Schafft | 320/333 |
| 3,927,410 | 12/1975 | Pimbley | 310/326 |
| 5,005,994 | 4/1991 | Yano | 400/124 |

FOREIGN PATENT DOCUMENTS 0698989  10/1953  United Kingdom ............... 310/326

*Primary Examiner*—Steven L. Stephan
*Assistant Examiner*—C. LaBalle
*Attorney, Agent, or Firm*—Armstrong, Westerman, Hattori, McLeland & Naughton

[57] ABSTRACT

A piezoelectric actuator device adapted for use in a printing machine and comprising a piezoelectric assembly and a movement magnifying mechanism for magnifying the movement of the piezoelectric assembly and for transferring the magnified movement to the printing wire. The movement magnifying mechanism includes a rigid member, a first spring connecting the second end of the piezoelectric assembly to the rigid member, and a second spring connecting the rigid member to the support base. A vibration absorbing means preferably comprising silicone rubber resin is inserted between the first and second springs to damp the vibration of the movement magnifying mechanism.

5 Claims, 4 Drawing Sheets

PIEZOELECTRIC ACUTATOR DEVICE WITH VIBRATION ABSORBING MEANS

BACKGROUND OF THE INVENTION

1. Field of the Invention

The present invention relates to a piezoelectric actuator device that is used, for example, in a wire-dot printing machine.

2. Description of the Related Art

A wire-dot printing machine comprises a plurality of printing elements each of which includes a printing wire for striking the paper to be printed. With the increased printing speed in the wire-dot printing machine, a piezoelectric actuator device comprising a piezoelectric assembly is often used in the printing element to move the printing wire in response to a given signal. The movement of the piezoelectric assembly is very small and a movement magnifying mechanism is provided in the printing element for magnifying the movement of the piezoelectric assembly and for transferring the magnified movement to the printing wire.

The movement magnifying mechanism includes a rigid member carrying the printing wire, a first spring attached to the piezoelectric assembly, and a second spring connecting the rigid member to the support base. The rigid member of the movement magnifying mechanism is thus pivotally supported to the base of the printing element by the second spring and moved by the piezoelectric assembly via the first spring.

The piezoelectric assembly is instantaneously activated to move the printing wire toward the paper to print a dot on the paper and then deactivated to return the printing wire. This action causes the rigid member of the movement magnifying mechanism to vibrate after the piezoelectric body is deactivated, and this vibration causes the printing wire to rebound toward the paper. If the amount of the rebound of the printing wire is large, the printing wire may reach the paper even though the piezoelectric assembly is not activate and make a ghost on the paper. If the piezoelectric assembly is next activated while the rigid member is vibrating and when it is returning to the original position, the desired movement of the rigid member toward the paper may not be smoothly accomplished. Also, the vibration of the rigid member of one of the printing elements is transferred to the rigid member of another printing element.

SUMMARY OF THE INVENTION

The object of the present invention is to solve the above described problems and to provide a piezoelectric actuator device that comprises a piezoelectric assembly and a movement magnifying mechanism including a rigid member, a first spring and a second spring by which the vibration of the rigid member of the movement magnifying mechanism is adequately damped.

According to the present invention, there is provided a piezoelectric actuator device comprising a stationary base, a piezoelectric assembly having a first end supported by the support base and a second end, a movement magnifying mechanism including a rigid member, a first spring connecting the second end of the piezoelectric assembly to the rigid member, and a second spring connecting the rigid member to the support base, and a vibration absorbing means inserted between the first and second springs.

With this arrangement, the rigid member can move as intended to act on an object and the vibration absorbing means adequately damps the vibration of the rigid member of the movement magnifying mechanism.

BRIEF DESCRIPTION OF THE DRAWINGS

The present invention will become more apparent from the following description of the preferred embodiments with reference to the accompanying drawings, in which.

DESCRIPTION OF THE PREFERRED EMBODIMENTS

Figure 1:
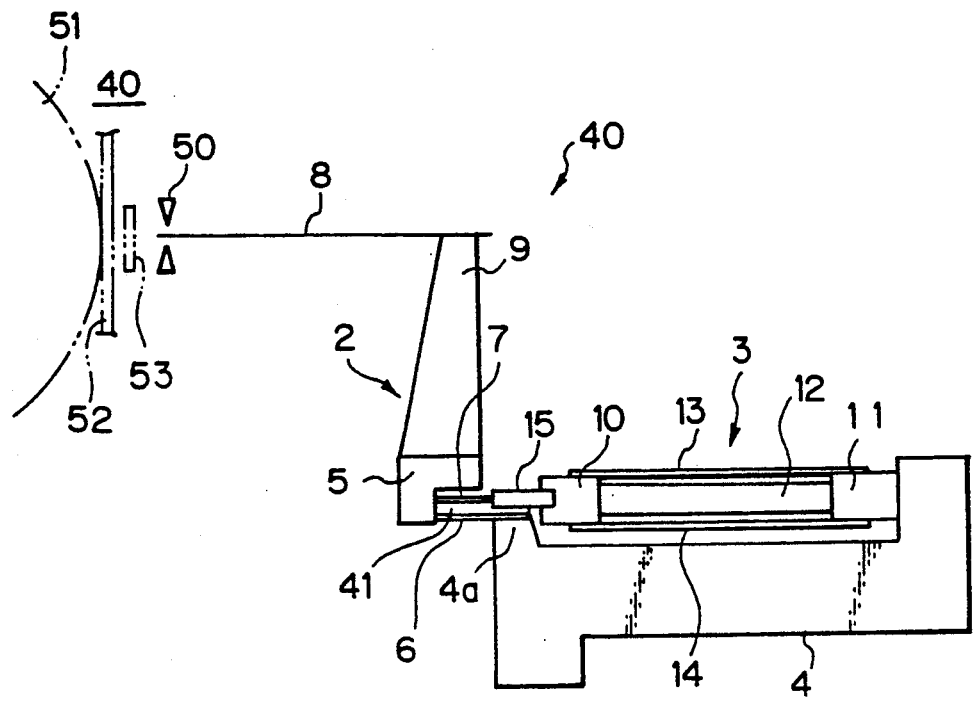
FIG. 1 is a diagrammatic side view of a printing element incorporating a piezoelectric actuator device according to the embodiment of the present invention.
Figure 5:
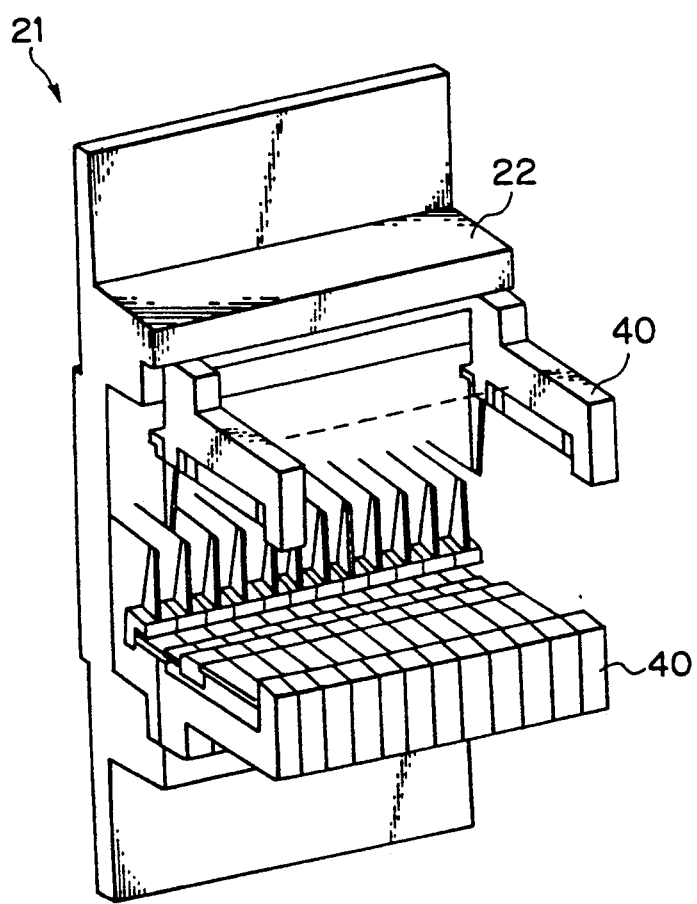
FIG. 5 is a partially broken perspective view of a printing head module comprising a plurality of printing elements of FIG. 1.
Figure 6:
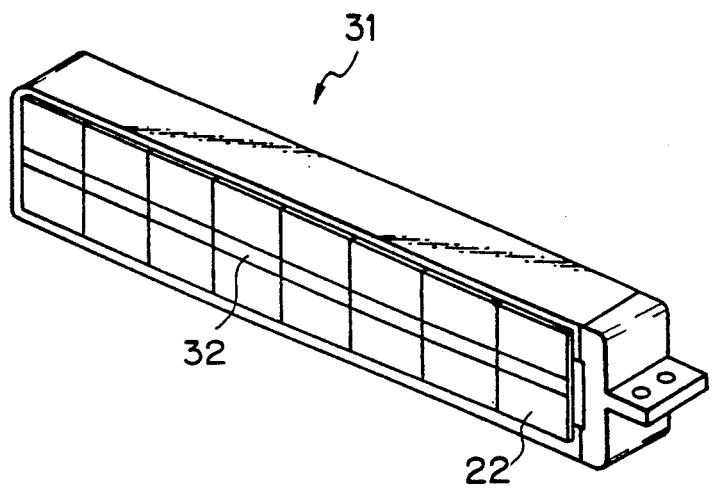
FIG. 6 is a perspective view of a printing head unit comprising a plurality of printing head modules of FIG. 5.

FIG. 1 shows a printing machine with a printing element 40. In FIG. 5, twenty four printing elements 40 are mounted in two rows to an element mounting frame 22 to form a printing head module 21. In FIG. 6, eight printing head modules 21 (shown by the element mounting frames 22) are further assembled to a printing head unit 31. The numeral 32 in FIG. 6 shows a wire guide portion provided in the element mounting frames 22. The printing head unit 31 may be mounted in the printing machine such as a shuttle printer having a reciprocating shuttle to which the printing head unit 31 is mounted.

Figure 2:
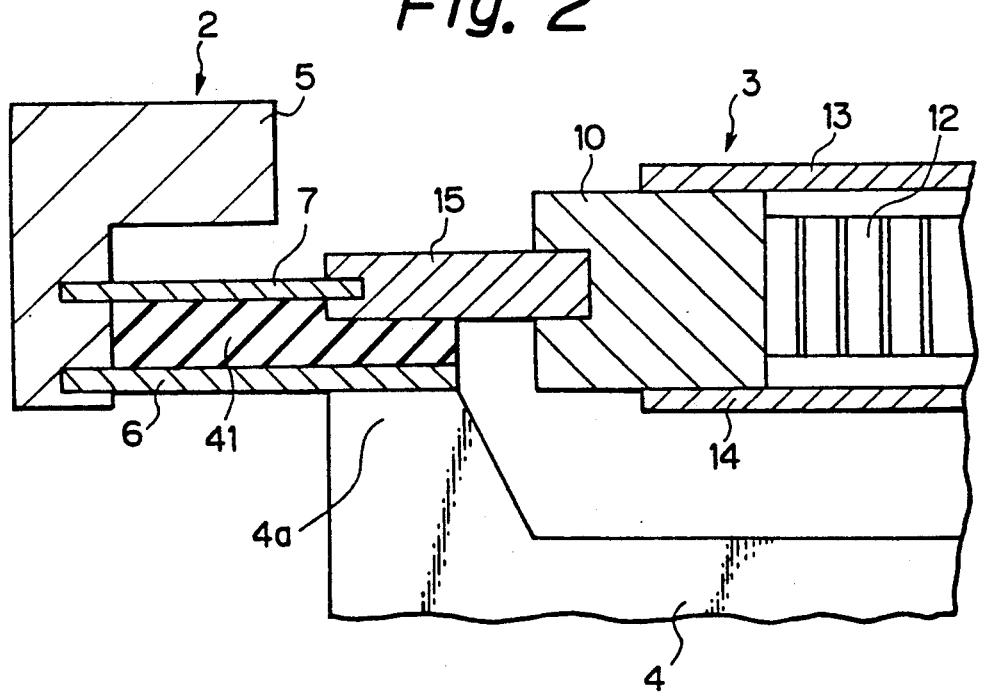
FIG. 2 is a partially enlarged cross-sectional view of the piezoelectric actuator device of FIG. 1.

In FIGS. 1 and 2, the printing element 40 comprises a printing wire 8 that is guided in a wire guide 50 in the printing machine. The printing machine includes a platen 51 on which paper 52 to be printed is fed. The printing wire 8 can strike the paper 52 via an inked ribbon 53 when the printing wire 8 is activated.

Figure 4:
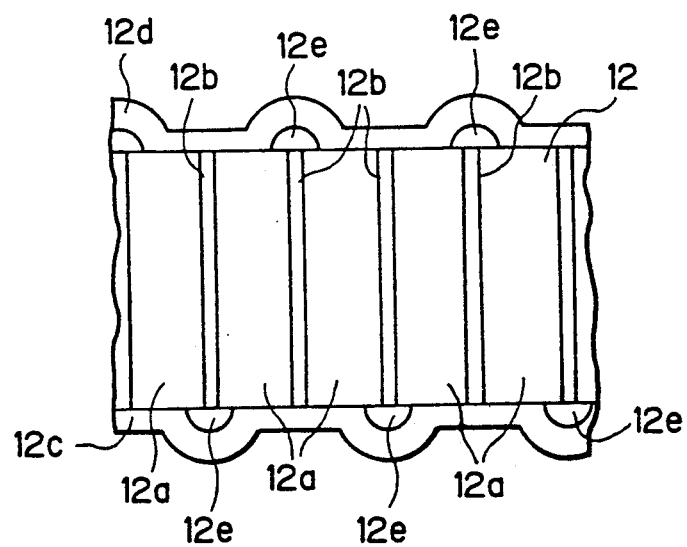
FIG. 4 is a partially enlarged cross-sectional view of the laminated piezoelectric element.

The printing element 40 includes a piezoelectric actuator device comprising a stationary base 4, a piezoelectric assembly 3 and a movement magnifying mechanism 2. The piezoelectric assembly 3 comprises an elongated laminated piezoelectric element 12 that is comprised of a plurality of thin piezoelectric plates 12a laminated together via electrode layers 12b arranged between the adjacent piezoelectric plates 12a, as shown in FIG. 4. Further electrode layers 12c and 12d are provided on the elongated piezoelectric element 12 at the opposite sides thereof to connect the alternating electrode layers 12b to the power source (not shown), and insulating elements 12e are arranged in staggered positions at the junctures between the electrode layers 12b and the electrode layers 12c and 12d.

Figure 3:
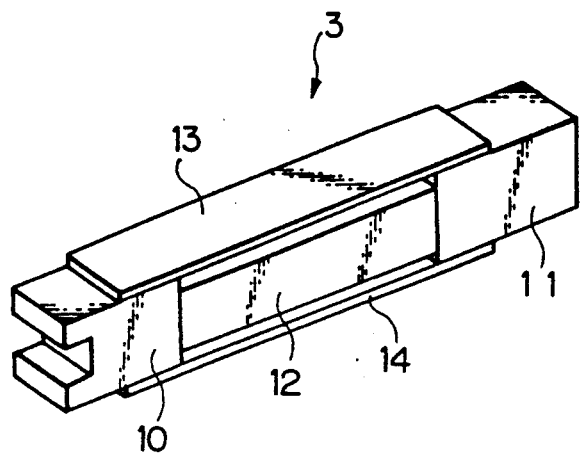
FIG. 3 is a perspective view of the piezoelectric assembly of FIGS. 1 and 2.

As shown in FIGS. 1 to 3, the elongated piezoelectric element 12 is longitudinally sandwiched by metal blocks 10 and 11. Springs 13 and 14 are provided between the metal blocks 10 and 11 to maintain the elongated piezoelectric element 12 in compression. The springs 13 and 14 are fixed to the opposite surfaces of the metal blocks 10 and 11 by a laser welding or the like while the springs 13 and 14 are held in tension. A connecting plate 15 is attached to the metal block 10.

The metal block 11 at one end of the piezoelectric assembly 3 is fixed to and supported by the stationary base 4 of the piezoelectric actuator device. The connecting plate 15 at the other end of the piezoelectric assembly 3 is connected to the movement magnifying mechanism 2.

The movement magnifying mechanism 2 has a rigid member, i.e., an armature 5 and an upwardly elongated beam 9 attached to the lower end of the armature 5. The printing wire 8 is carried at the upper end of the upwardly elongated beam 9. The movement magnifying mechanism 2 has a first leaf spring 7 connecting the free end of the piezoelectric assembly 3, i.e., the connecting plate 15, to the armature 5 and a second leaf spring 6 connecting the armature 5 to the stationary base 4. The stationary base 4 is generally U-shaped. The second leaf spring 6 is carried at an upper surface of one upright portion 4a of the U-shaped stationary base 4 and the piezoelectric assembly 3 is carried at an inner surface of the other upright porting of the U-shaped stationary base 4 so that the second leaf spring 6 is parallel to the piezoelectric assembly 3. The first leaf spring 7 is in line with the piezoelectric assembly 3 and thus parallel to the first leaf spring 7. The gap between the first and second leaf springs 6 and 7 is typically 0.4 to 0.6 millimeters, and the gap between the second leaf springs 7 and the connecting plate 15 is typically 0.2 millimeters.

As shown in FIGS. 1 and 2, a vibration absorbing means 41 is inserted between the first and second leaf springs 6 and 7. The vibration absorbing means 41 preferably comprises resin, and more preferably silicone rubber resin. The preferable silicone rubber resin is "KE105(A,·B)" distributed by Shinetsu Chemistry K.K. in Japan. This silicone rubber resin is a gel-like block having high viscosity and is soft and elastic, and thus provides good vibration absorbing properties. This silicone rubber resin can be readily filled in the gap between the first and second leaf springs 6 and 7.

In operation, when an electric voltage is supplied to the elongated piezoelectric element 12, it expands toward the armature 5 of the movement magnifying mechanism 2 by tens of units of microns, for example. The movement of the elongated piezoelectric element 12 is transferred to the armature 5 by the first leaf spring 6, and the armature 5 with the upwardly elongated beam 9 is moved pivotally on the second leaf spring 7, and therefore, the printing wire 8 extends to the inked ribbon 53 and the paper 52, by approximately 100 microns, for example, to print a dot on the paper 52. The electric voltage is then released and the elongated piezoelectric element 12 retracts to the original position to return the movement magnifying mechanism 2 and the printing wire 8 to the respective original positions.

Figure 7:
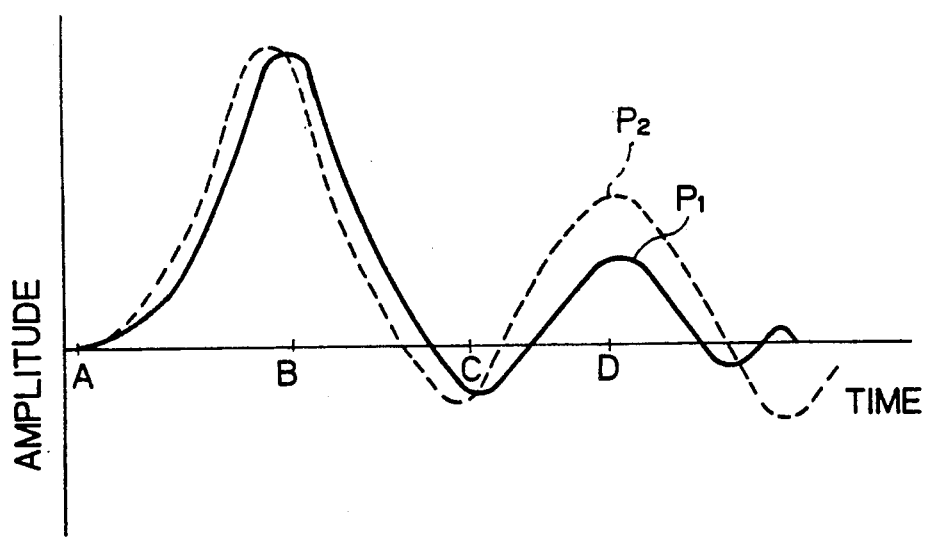
FIG. 7 is a view illustrating the movement of the rigid member of the movement magnifying mechanism.

FIG. 7 shows the movement of the armature 5 of the movement magnifying mechanism 2. At the point A, the elongated piezoelectric element 12 is activated and the armature 5 of the movement magnifying mechanism 2 starts to move. Then at the point B, the elongated piezoelectric element 12 is deactivated and the armature 5 of the movement magnifying mechanism 2 starts to return.

The broken line curve shows the movement of the armature 5 of a prior art in which the vibration absorbing means 41 is not provided between the first and second leaf springs 6 and 7. The solid line curve shows the movement of the armature 5 according to the present invention in which the vibration absorbing means 41 is provided between the first and second leaf springs 6 and 7.

The broken line curve and the solid line curve start to rise at point A to the respective peaks. The response of the broken line curve may be just a little faster than that of the solid line curve but the peaks are substantially at the same level. Therefore, a good printing operation can be accomplished in either case. Then, the broken line curve and the solid line curve start to decline at point B toward the original position but an overshoot occurs so that both curves continue to decline beyond the original position to the respective valleys approximately at point C. Then, the broken line curve and the solid line curve again start to rise, and in this manner, the armature 5 of the movement magnifying mechanism 2 vibrates.

The broken line curve and the solid line curve will reach the respective peaks $P_1$ and $P_2$ of the first cycle of the vibration approximately at point D. In this point D, the peak P of the solid line curve becomes smaller than the peak $P_2$ of the broken line curve by the damping effect of the vibration absorbing means 41, which may act on the first leaf spring 6 to prevent flexure thereof. Therefore, according to the present invention, the amount of rebound of the armature 5 with the upwardly extending beam 9 and the printing wire 8 becomes small. The vibration absorbing means 41 may also act on the second leaf spring 7 to prevent an accidental movement of the armature 5, which may be transferred from the stationary base 4.

We claim:

1. A piezoelectric actuator device, comprising:
   a stationary base;
   a piezoelectric assembly having a first end supported by the support base and a second end;
   a movement magnifying mechanism including a rigid member;
   a first spring connecting the second end of the piezoelectric assembly to the rigid member, and a second spring connecting the rigid member to the support base, and a vibration absorbing means inserted between the first and second springs, the vibration absorbing means extending along the lengths of the first and second springs.

2. A piezoelectric actuator device according to claim 1, wherein said first and second springs are leaf springs arranged parallel to each other.

3. A piezoelectric actuator device according to claim 1, wherein said vibration absorbing means comprises resin.

4. A piezoelectric actuator device according to claim 3, wherein said vibration absorbing means comprises silicone rubber resin.

5. A piezoelectric actuator device according to claim 1, wherein said piezoelectric actuator is used in a printing machine including a printing wire that is attached to the rigid member of the movement magnifying mechanism.

* * * * *